(12) United States Patent
Deck et al.

(10) Patent No.: US 12,607,582 B2
(45) Date of Patent: Apr. 21, 2026

(54) OPTICAL EXTRACTION PROBE FOR ELECTRON MICROSCOPE AND OTHER VACUUM CHAMBERS

(71) Applicant: Thermo Electron Scientific Instruments LLC, Madison, WI (US)

(72) Inventors: Francis Deck, Madison, WI (US); Justin Morrow, Cincinnati, OH (US)

(73) Assignee: Thermo Electron Scientific Instruments LLC, Madison, WI (US)

( * ) Notice: Subject to any disclaimer, the term of this patent is extended or adjusted under 35 U.S.C. 154(b) by 401 days.

(21) Appl. No.: 18/295,334

(22) Filed: Apr. 4, 2023

(65) Prior Publication Data

US 2023/0333034 A1 Oct. 19, 2023

Related U.S. Application Data

(60) Provisional application No. 63/363,181, filed on Apr. 19, 2022.

(51) Int. Cl.
| | |
|---|---|
| *G01N 21/65* | (2006.01) |
| *G01N 23/2251* | (2018.01) |
| *H01J 37/22* | (2006.01) |
| *G02B 17/00* | (2006.01) |

(52) U.S. Cl.
CPC ......... *G01N 23/2251* (2013.01); *G01N 21/65* (2013.01); *H01J 37/228* (2013.01); *G01N 2201/0636* (2013.01); *G02B 17/008* (2013.01)

(58) Field of Classification Search
CPC .............. G02B 17/008; G02B 17/002; G01N 2201/0636; G01N 2201/0637; G01N 21/65; G01N 23/2251; G01N 23/2254; H01J 37/228; H01J 37/226; H01J 2237/2808
See application file for complete search history.

(56) References Cited

U.S. PATENT DOCUMENTS

| | | | | |
|---|---|---|---|---|
| 3,604,932 A | * | 9/1971 | Beach ........................ | G01J 5/07 |
| | | | | 348/E3.01 |
| 4,594,226 A | * | 6/1986 | Reedy ................ | G01N 21/3504 |
| | | | | 250/341.1 |

(Continued)

FOREIGN PATENT DOCUMENTS

WO WO-2019035483 A1 2/2019

OTHER PUBLICATIONS

Amirian S., "Investigations towards an Optical Transmission Line for Longitudinal Phase Space Measurements at PITZ," Sep. 1, 2005, XP093061729, 9 pages, Retrieved from the Internet URL: https://www-zeuthen.desy.de/students/2005/doc/Amirian.pdf.

(Continued)

*Primary Examiner* — Wyatt A Stoffa
(74) *Attorney, Agent, or Firm* — Bo Wang

(57) ABSTRACT

A beam extraction system is provided. The beam extraction system includes a first focusing optic, a second focusing optic, and an optic relay coupled to the first focusing optic and the second focusing optic. The first focusing optic is configured to form a light beam from light collected from a sample positioned at a focal point of the first focusing optic. The second focusing optic is configured to couple the light beam to a detector. The optic relay provides an optic path for the light beam from the first focusing optic to the second focusing optic.

16 Claims, 5 Drawing Sheets

(56) References Cited

U.S. PATENT DOCUMENTS

| | | | | |
|---|---|---|---|---|
| 4,810,093 A * | 3/1989 | Doyle | ..................... | G01J 3/08 |
| | | | | 356/455 |
| 5,071,251 A * | 12/1991 | Hochberg | ......... | G01B 9/02039 |
| | | | | 356/513 |
| 5,225,678 A * | 7/1993 | Messerschmidt | .... | G01N 21/255 |
| | | | | 250/341.7 |
| 5,311,021 A * | 5/1994 | Messerschmidt | ...... | G02B 21/04 |
| | | | | 250/353 |
| 5,828,066 A * | 10/1998 | Messerschmidt | ......... | G01J 3/10 |
| | | | | 250/339.07 |
| 6,885,445 B2 * | 4/2005 | Bennett | ................ | H01J 37/256 |
| | | | | 356/326 |
| 7,078,696 B2 * | 7/2006 | Nesnidal | ............. | G02B 21/088 |
| | | | | 250/353 |
| 7,456,950 B2 * | 11/2008 | Deck | ...................... | G01J 3/024 |
| | | | | 356/326 |
| 7,718,979 B2 * | 5/2010 | Knowles | .............. | H01J 37/256 |
| | | | | 250/492.1 |
| 8,264,693 B2 * | 9/2012 | Stoica | ............... | G01R 33/1284 |
| | | | | 356/502 |
| 9,200,887 B2 * | 12/2015 | Potsaid | ............. | G01B 9/02091 |
| 10,018,579 B1 * | 7/2018 | Shriyan | .............. | G01N 23/2254 |
| 10,109,451 B2 * | 10/2018 | Jost | ....................... | H01J 37/026 |
| 10,545,337 B2 * | 1/2020 | Sung | ...................... | G02B 3/14 |
| 11,422,363 B2 * | 8/2022 | Hattori | .................. | G02B 21/06 |
| 11,798,778 B2 * | 10/2023 | Monachon | ........... | H01J 37/228 |
| 12,014,896 B2 * | 6/2024 | Davies | .............. | G01N 23/2254 |
| 12,029,486 B2 * | 7/2024 | Straub | ................. | A61B 3/0033 |
| 12,253,391 B2 * | 3/2025 | Miles | .................. | G01D 5/2412 |
| 2004/0131146 A1 * | 7/2004 | Chen | ................... | G01N 23/223 |
| | | | | 378/41 |

| | | | | |
|---|---|---|---|---|
| 2006/0231762 A1 * | 10/2006 | Ohtake | ................ | G01N 21/552 |
| | | | | 250/341.8 |
| 2007/0023655 A1 * | 2/2007 | Nishikata | ............. | H01J 37/244 |
| | | | | 250/310 |
| 2007/0235650 A1 * | 10/2007 | Federici | ............... | G01N 21/636 |
| | | | | 250/341.8 |
| 2010/0302535 A1 * | 12/2010 | Lipson | .................. | G01J 3/4412 |
| | | | | 356/301 |
| 2013/0016319 A1 * | 1/2013 | Vohnsen | .............. | A61B 3/1025 |
| | | | | 351/246 |
| 2014/0104618 A1 | 4/2014 | Potsaid et al. | | |
| 2016/0062112 A1 * | 3/2016 | Potsaid | ............. | G02B 27/0068 |
| | | | | 356/497 |
| 2016/0306390 A1 * | 10/2016 | Vertegaal | .............. | G06F 1/1626 |
| 2019/0103248 A1 * | 4/2019 | Niu | ........................ | H01J 37/10 |
| 2020/0249454 A1 * | 8/2020 | Kobayashi | ................ | G01J 3/10 |
| 2022/0020559 A1 * | 1/2022 | Monachon | ............ | H01J 37/045 |
| 2022/0075170 A1 * | 3/2022 | Froigneux | ........... | G02B 21/006 |
| 2022/0178854 A1 * | 6/2022 | Fouchier | ............ | G01N 23/2254 |
| 2022/0216028 A1 * | 7/2022 | Jean | ...................... | H01J 37/228 |

OTHER PUBLICATIONS

PCT/US2023/017371, International Search Report and Written Opinion, Sep. 4, 2023, 18 pages.
PCT/US2023/017371, Partial International Search Report and Provisional Opinion, Jul. 14, 2023, 11 pages.
Sasaki H., et al., "Scalability Analysis of Diffractive Optical Element-Based Free-Space Photonic Circuits for Interoptoelectronic Chip Interconnections," Applied Optics, Apr. 10, 2001, vol. 40, No. 11, XP001066012, pp. 1843-1855.

* cited by examiner

400

402 — Positioning a sample in a first environment

404 — Focusing a first optic on the sample and forming a light beam

406 — Extending the light beam through an optic relay

408 — Coupling the light beam to a detector

OPTICAL EXTRACTION PROBE FOR ELECTRON MICROSCOPE AND OTHER VACUUM CHAMBERS

CROSS-REFERENCE TO RELATED APPLICATIONS

The present application claims the priority benefit from U.S. Patent Application Ser. No. 63/363,181, filed Apr. 19, 2022, which is hereby incorporated by reference herein in its entirety for all purposes.

FIELD OF THE INVENTION

This invention is directed to an optical extraction probe. In particular, an optical extraction probe configured to extract a sample light to and from different environments is described.

BACKGROUND OF THE INVENTION

For performing spectroscopic work inside of vacuum chambers, a light beam must often be brought in and out of the chamber, so that a specimen inside the chamber can be observed by a spectrometer on the outside. The optics need to preserve image quality over a particular field of view without excessive blurring or vignetting. In addition, the optics must often share space with other instruments and detectors within the chamber, such as the beam of a scanning electron microscope (SEM).

U.S. Pat. No. 6,885,445 (the '445 patent) describes an arrangement of off-axis parabolic (OAP) mirrors, where one mirror is held above the specimen, and a hole in the mirror allows an electron beam to pass through. Moreover, the '445 patent describes a pairing of such mirrors so that one mirror cancels the optical aberrations introduced by the other. FIG. 1A shows a first arrangement, which is an optical aberration cancelling arrangement, including a pair of OAP mirrors 101,102. Two flat mirrors 104 to redirect light rays 105 in the beam are also included. The OAP mirrors 101, 102 are arranged with the foci in the same horizontal plane 106, so that the matching OAP mirrors are positioned to focus light at a same horizontal plane 106. In contrast, FIG. 1B illustrates a pairing where the two OAP mirrors 101, 102 are arranged with the focal point of OAP mirror 102 in a horizontal plane 108, which is different from horizontal plane 106. This second arrangement exacerbates optical aberrations.

As a pair of focusing optics, such as OAP mirrors 101 and 102 are separated by larger and larger distances, the field of view decreases and the image displays vignetting and blurring. This occurs because light rays 105 introduced along the optical axis will pass from one mirror to the other, but off-axis rays 105' such as observed over an extended sample area will be collected by one mirror and miss the other. This is illustrated by FIG. 1C, which shows how over a large distance, off-axis light rays 105' from OAP mirror 101, miss OAP mirror 102. This also occurs in the reverse direction. For example, in a Raman instrument, the probe laser light will be collected by one mirror and miss the second in an imaging experiment.

Accordingly, there remains a need for methods and systems to pass a sample light beam to and from different environments over distances while preserving the image quality.

SUMMARY

Systems, methods, and products to address the above identified and other needs are described herein with respect to the following illustrative, non-limiting, implementations. Various alternatives, modifications and equivalents are possible.

In accordance with a first aspect, a beam extraction system is provided. The beam extraction system includes a first focusing optic, a second focusing optic, and an optic relay coupled to the first focusing optic and the second focusing optic. The first focusing optic is configured to form a light beam from light collected from a sample positioned at a focal point of the first focusing optic. The second focusing optic is configured to couple the light beam to a detector. The optic relay provides an optic path for the light beam from the first focusing optic to the second focusing optic.

In accordance with a second aspect, a spectroscopic system is provided. The spectroscopic system includes an enclosure including a first focusing optic configured to form a light beam from light collected from a sample positioned in the enclosure and at a focal point of the first focusing optic. A second focusing optic of the system is configured to couple the light beam to a detector positioned outside of the enclosure. An optic relay is coupled to the first focusing optic and to the second focusing optic. The optic relay provides an optic path for the light beam from the first focusing optic to the second focusing optic. The system also includes an extraction window in the optic path.

In accordance with a third aspect, a method of passing sample light between different environments is provided. The method includes positioning a sample in a first environment and focusing a first optic on the sample and forming a light beam from a sample light received from the sample. The light beam is extended from the first focusing optic to a second focusing optic through an optic relay coupled to the first focusing optic and the second focusing optic. The light beam is coupled to a detector positioned in a second environment.

The beam extraction systems described herein provide methods to pass a sample light beam to and from different environments over distances while preserving the image quality.

BRIEF DESCRIPTION OF THE DRAWINGS

The foregoing and other features and advantages of the present embodiments will be more fully understood from the following detailed description of illustrative embodiments taken in conjunction with the accompanying drawings.

Figure 1A:
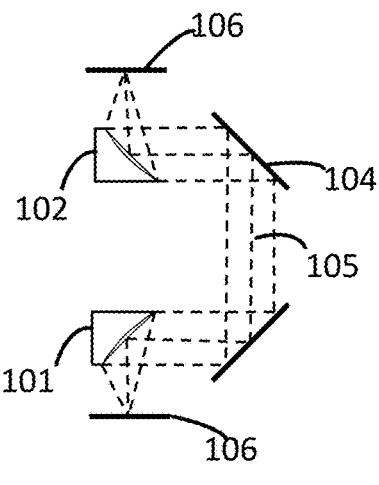
FIG. 1A is a diagram showing an optical aberration cancelling arrangement using a pair of OAP mirrors.

The figures referred to above are not drawn necessarily to scale, should be understood to provide a representation of particular embodiments, and are merely conceptual in nature and illustrative of the principals involved. The same reference numbers are used in the drawings for similar or identical components and features shown in various alternative embodiments. The beam extraction systems disclosed herein would have configurations and components determined, in part, by the intended application and environment in which they are used.

DETAILED DESCRIPTION

In the description of the invention herein, it is understood that a word appearing in the singular encompasses its plural counterpart, and a word appearing in the plural encompasses its singular counterpart, unless implicitly or explicitly understood or stated otherwise. Furthermore, it is understood that for any given component or embodiment described herein, any of the possible candidates or alternatives listed for that component may generally be used individually or in combination with one another, unless implicitly or explicitly understood or stated otherwise. The term "about" as used herein is meant to mean close to, or approximately, a particular value, within the constraints of sensible, commercial engineering objectives, costs, manufacturing tolerances, and capabilities in the field of radiometric gauging. The term "substantially" as used herein is meant to mean mostly, or almost the same as, within the constraints of sensible, commercial engineering objectives, costs, manufacturing tolerances, and capabilities in the field of radiometric gauging.

Accordingly, unless indicated to the contrary, the numerical parameters set forth in the specification and attached claims are to be understood as being modified by the term "about" and may vary depending upon the desired properties sought to be obtained by the subject matter presented herein. At the very least, and not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the subject matter presented herein are approximations, the numerical values set forth in the specific examples are reported as precisely as possible. Any numerical values, however, inherently contain certain errors necessarily resulting from the standard deviation found in their respective testing measurements.

Figure 2A:
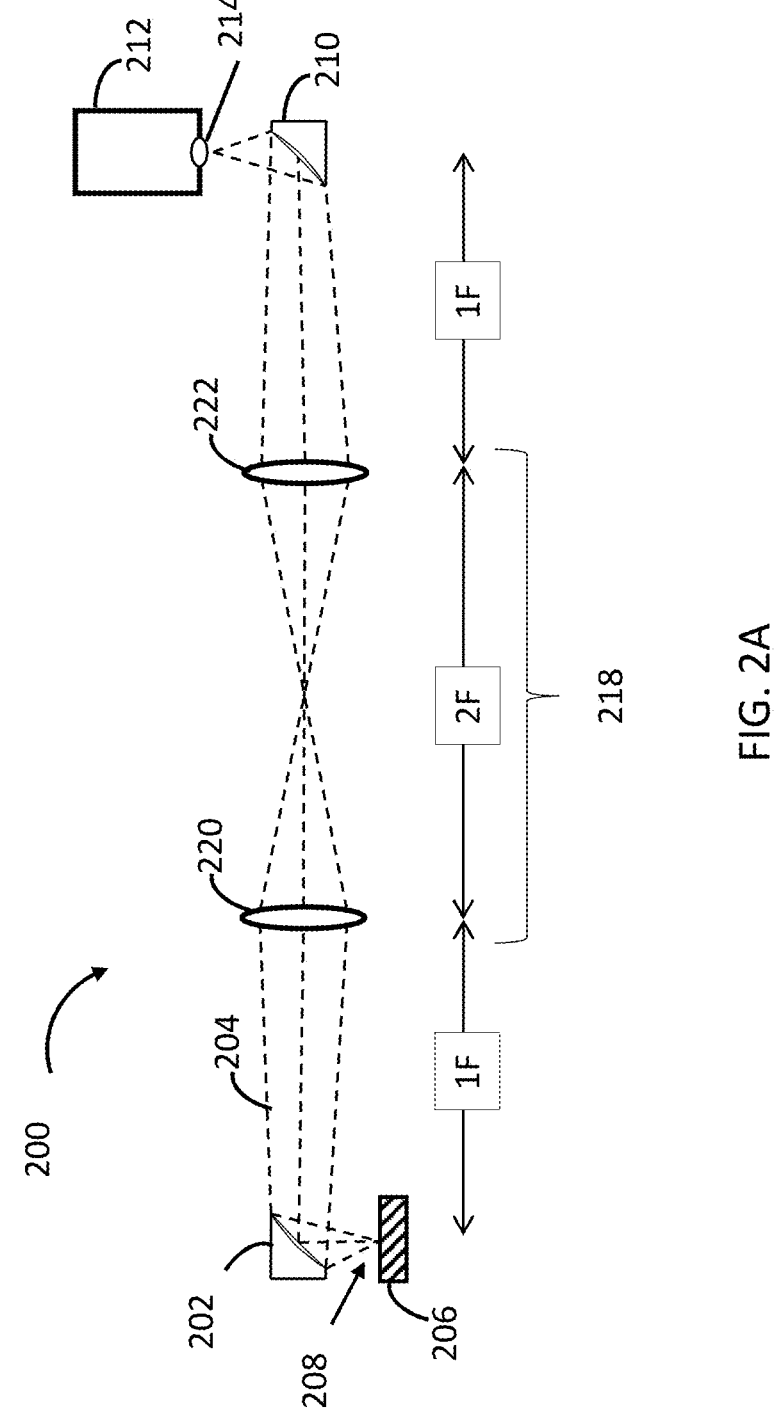
FIG. 2A is a diagram illustrating a beam extraction system, according to some implementations.

FIG. 2A is a diagram illustrating a beam extraction system 200, according to some implementations. A first focusing optic 202 forms a light beam 204 from light collected from a sample 206 positioned at a focal point 208 of the first focusing optic 202. A second focusing optic 210 couples the light beam 204 to a detector 212. For example, the light beam can be focused on an objective lens 214 that is part of a Raman spectrometer, an FTIR spectrometer, or camera that is the detector 212. In some implementations, the light beam 204 is focused directly at an entrance slit of a spectrograph, where in FIG. 2A, the objective lens 214 is replace with an entrance slit, and the detector 212 is a spectrograph.

The beam extraction system 200 also includes an optic relay 218. The optic relay 218 is optically coupled to the first focusing optic 202 and to the second focusing optic 210. The optic relay 218 provides an optic path for the light beam 204 from the first focusing optic 202 to the second focusing optic 210. The optic relay 218 can include optics such as lenses, mirrors and combinations of these that extend the light beam 204. In some implementations, the optic relay 218 collimates or re-collimates the light beam 204 while extending it.

According to some implementations, the optic relay 218 includes a third focusing optic 220 having a focal length of F and a fourth focusing optic 222 also having a focal length of F. The optic relay 218, in combination with the first focusing optic 202 and the second focusing optic 210, provides a 4F optic path length from the first focusing optic 202 to the second focusing optic 210. The optic relay 218 is coupled at one end by the third focusing optic 220 to the first focusing optic 202, and is coupled at a second end by the fourth focusing optic 222 to the second focusing optic 210. In some implementations, the sum of the distance from the third focusing optic 220 to the first focusing optic 202 and the fourth focusing optic 222 to the second focusing optic 210 is 2F. In some implementations, as illustrated in FIG. 2A, the distance from the third focusing optic 220 to the first focusing optic 202 and the distance from the fourth focusing optic 222 to the second focusing optic 210 are each F. In some implementations, the distance between the third focusing optic 220 to the fourth focusing optic 222 is 2F.

In some implementations, the third focusing optic 220 matches the fourth focusing optic. As used herein, a "matching" optic or an optic that "matches" another optic means they are selected to perform equivalently. For example, for the light in question (e.g. light beam 204), matching optics have the same focal length, transmission, aberration, curvature, reflectivity, reflective surface area, and transmission area. Matching optics can be selected by purchasing an item from a commercial source where the items have the same part number and the same specifications.

Figure 2B:
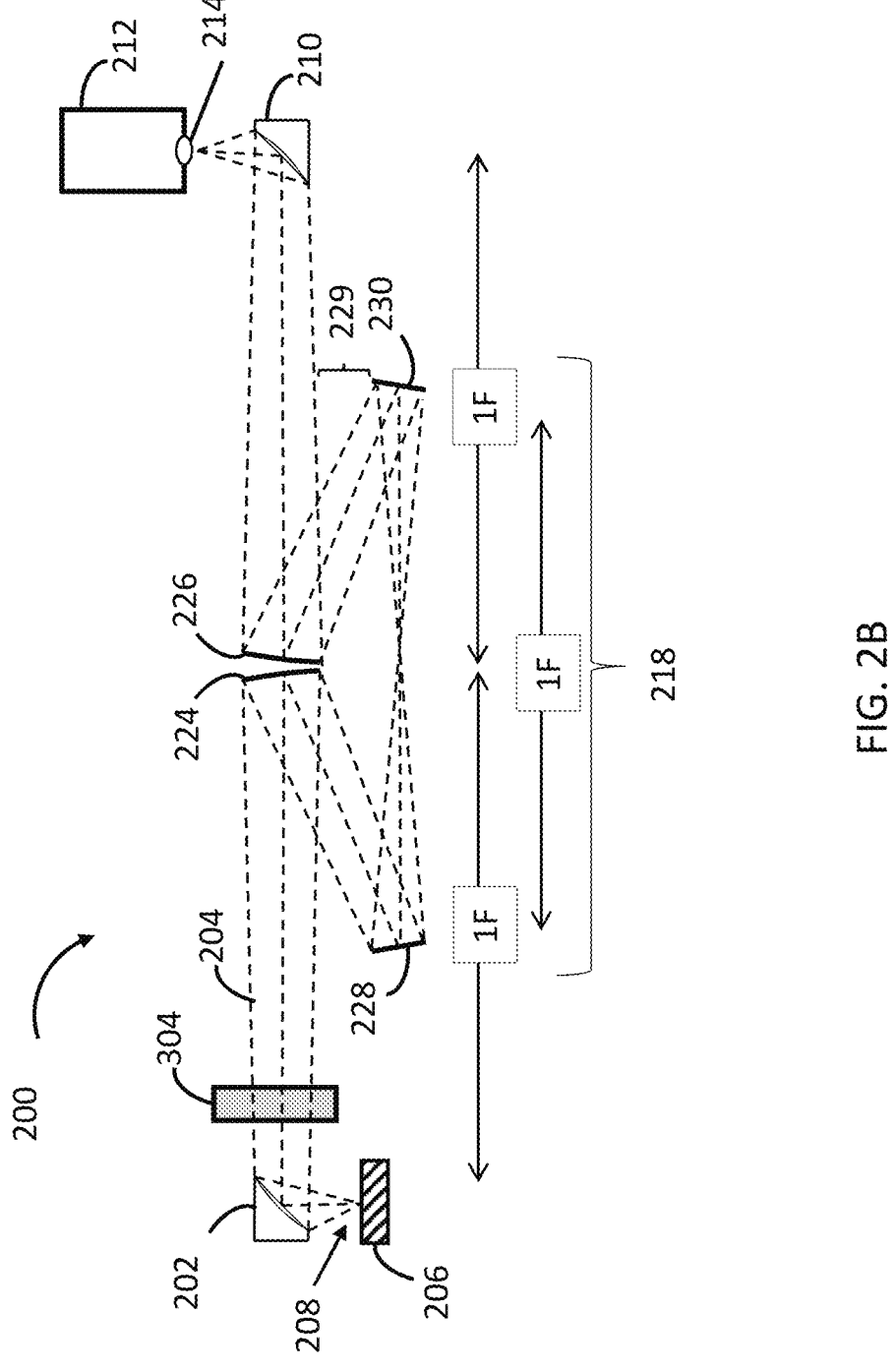
FIG. 2B a diagram illustrating a beam extraction system, according to some other implementations.

In some implementations, as indicated by FIG. 2A, the third focusing optic 220 and the fourth focusing optic 222 are lenses, such as glass lenses. In some other implementations of the beam extraction system 200, mirrors are used as illustrated by FIG. 2B. According to this implementation, the optic relay 218 includes a first concave mirror 224 positioned to reflect the light beam 204 formed by the first focusing optic 202, and a second concave mirror 226 positioned to reflect the light beam 204 to the second focusing optic 210. The sum of the distance from the first concave mirror 224 to the first focusing optic 202 and the second concave mirror 226 to the second focusing optic 210 is 2F. In some implementations, the first concave mirror 224 is positioned at a distance of F from the first focusing optic 202 and the second concave mirror 226 is positioned a distance of F from the second focusing optic 210.

In some implementations, the first concave mirror 224 and the second concave mirror 226 are matching concave mirrors and are positioned substantially back to back. Here "back to back" refers to positioning of the first concave mirror 224 as close to the second concave mirror 226 as possible, where the back of the mirrors refers to the non-reflective surface opposite the reflective surface of the respective mirror. For example, if mounting requirements allow for backs of the concave mirrors 224, 226 to be touching, they will be positioned in contact with each other. This is often not possible due to requirements for some degree of alignment adjustment or mounting frame requirements. In some implementations at least one point at the back of the concave mirrors 224, 226 are not more than 1 cm apart (e.g., not more than 0.5 cm apart, or not more than 1 mm apart).

Since the concave mirrors 224 and 226 reflect the light beam 204 back generally in the direction of first focusing optic 202 and the second focusing optic 210 respectively, the optic relay 218 in this implementation includes a flat mirror relay configured to reflect the light beam 204 from the first concave mirror 224 to the second concave mirror 226, traversing a distance 2f. The flat mirror relay can include two or more flat mirrors. In some implementations, the flat mirror relay includes a first flat mirror 228 positioned in the light beam 204 at a distance n from the first concave mirror 224, and a second flat mirror 230 positioned in the light beam 204 at a distance F-n from the second concave mirror 226. Here, n is a real number that is greater than zero and less than the focal length F of the concave mirrors 224, 226 (i.e., 0<n<F). In some implementations, n is about 0.5. In some implementations, the first flat mirror 228 and the second flat mirror 230 are matching mirrors.

The concave mirrors 224, 226 are also angled, such that the principle axes are not horizontal to the page in FIG. 2B. In some implementations, the mirrors forming the optic relay 218 are angled so that the mirrors 228 and 230 do not occlude the light beam 204. That is, the first concave mirror 224 is angled so that substantially all the light (e.g., at least 95% of the light or at least 99% of the light) that is reflected from the first concave mirror 224 is reflected by the first flat mirror 228 and the first flat mirror 228 does not occlude the light beam 294 in a first leg between first focusing optic 202 and the first concave mirror 224. Similarly, the second concave mirror 226 is angled so that substantially all the light that is reflected from the second concave mirror 226 is reflected by second flat mirror 230 and second flat mirror 230 does not occlude the light beam 204 in a second leg between second focusing optic 210 and second concave mirror 226. In some implementations, the axes of the concave mirrors 224, 226 are each angled so that mirrors 228 and 230 are as close as possible to touching beam 204, that is, the distance 229 is close to 0 length units as possible. In some implementations, the axes of the concave mirrors 224, 226 are each independently angled by at least 1 degree, at least 2 degree, at least 5 degree, at least 10 degree, at least 20 degree, or at least 30 degrees from the horizontal.

In some implementations, each of the first focusing optic 202 and the second focusing optic 210 are independently selected from OAP mirrors, Schwarzschild objectives, and lenses. In some implementations, each of the first focusing optic 202 and the second focusing optic 210 are independently selected from OAP mirrors, and Schwarzschild objectives. As depicted in FIGS. 2A and 2B, the first focusing optic 202 and the second focusing optic 210 are OAP mirrors. The choice of focusing optics can be selected by a person skilled in the art informed as to the current optics technology. For example, Schwarzschild objectives, glass lenses and OAP mirrors can be used for manipulation of Raman excitation light; while mirrors are currently known as most appropriate for Infrared (IR) light manipulation. Likewise, for light generated by cathodoluminescence, some wavelengths of interest, such as in the ultraviolet (UV) range, are greatly attenuated by glass lenses making mirrors and Schwarzschild objectives currently a better option. Similar factors can be taken into consideration when selected for the other optic elements such as the third focusing optic 220 and the fourth focusing optic 222.

Figure 1B:
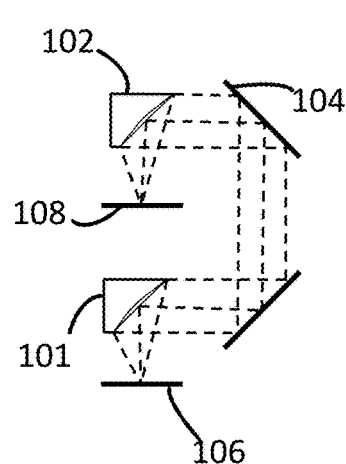
FIG. 1B is a diagram showing an arrangement of the pair of OAP mirrors that leads to optical aberrations.
Figure 1C:
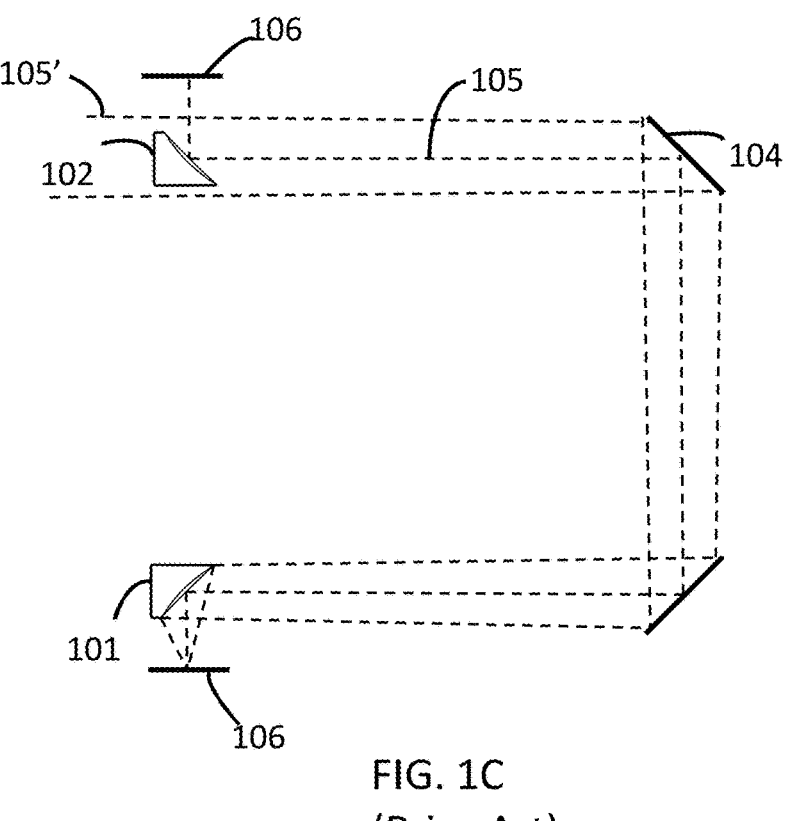
FIG. 1C is a diagram illustrating a pair of focusing optics separated by a large distance.

In some implementations, the first and second focusing optics 202, 210 are matching OAP mirrors. This provides an option where the first focusing optic 202 and the second focusing optic 210 are positioned to reflect the light in the same horizontal plane. That is the focal point 208 and the object lens 214, which is at the focal point of the second focusing optic 210, are in the same horizontal plane. The benefits of using the same horizontal plane is a reduction in optical aberrations, as previously described with reference to FIGS. 1A-1C.

In some implementations, the beam extraction system 200 further includes an extraction window 304 that is positioned between the first focusing optic 202 and the second focusing optic 210. The extraction window 304 is positioned in the path of the light beam 204 and is selected to be at least partially transparent to the light beam 204. For example, the extraction window 304 allows at least 90% of the light beam 204 through the window (e.g., at least 95% or at least 99%). The extraction window 304 can be mounted to a wall that is part of a structure, such as a vacuum chamber containing the sample 206, a housing containing the detector 212, or a tube enclosing the optic relay 218. The extraction window 304 is designed to be impervious to fluids (air, gases). In some implementations, the extraction window 304 can withstand high vacuum (e.g., up to $10^{-12}$ torr).

Also, according to some implementation, a linear distance between the first focusing optic 202 and the second focusing optic 210 is at least 10 cm, such as at least 20 cm to 100 cm, or at least 20 cm to 60 cm. In some implementations, the distance between the first focusing optic 202 and the second focusing optic 210 is less than or equal to 4F. As used herein a "linear" distance refers to the shortest, or straight-line path, between the first focusing optic 202 and the second focusing optic 210.

A person of skill in the art recognizes that the 4F optical path length and linear distance can be manipulated (i.e. selected) base on the kind of optic elements used and the focal lengths of said optic elements. For example, where the third and the fourth focusing optics 220, 222 are selected to be lenses (FIG. 2A) the 4F optical path between the first focusing optic 202 and the second focusing optic 210 does not need to be folded, as when the concave mirrors 224, 226 (FIG. 2B) are selected. The linear distance can also be manipulated by changing the angle from horizontal that the concave mirrors 224, 226 are set to. Clearly the focal length F selected for the optic components will also determine the 4F optical path length and linear distance. In some implementations, F is selected to be between 1 cm and 50 cm.

Another way to extend the linear distance between the first focusing optic 202 and the second focusing optic 210 is to include additional optic relays 218. For example, using two or more optic relays 218 in series inserted between the first focusing optic 202 and the second focusing optic 210. In some implementations, the optic relay 218 includes a m·4F optic path from the first focusing optic 202 to the second focusing optic 210, wherein m is an integer greater than one. In some implementations M is 2, 3 or 4. Although implementations of more than one 4F optic path adds complexity to the system since more mirrors are used, such an implementation provides the advantage that smaller diameter meters can be used for an equivalent total extraction beam length of light beam 204.

Figure 3:
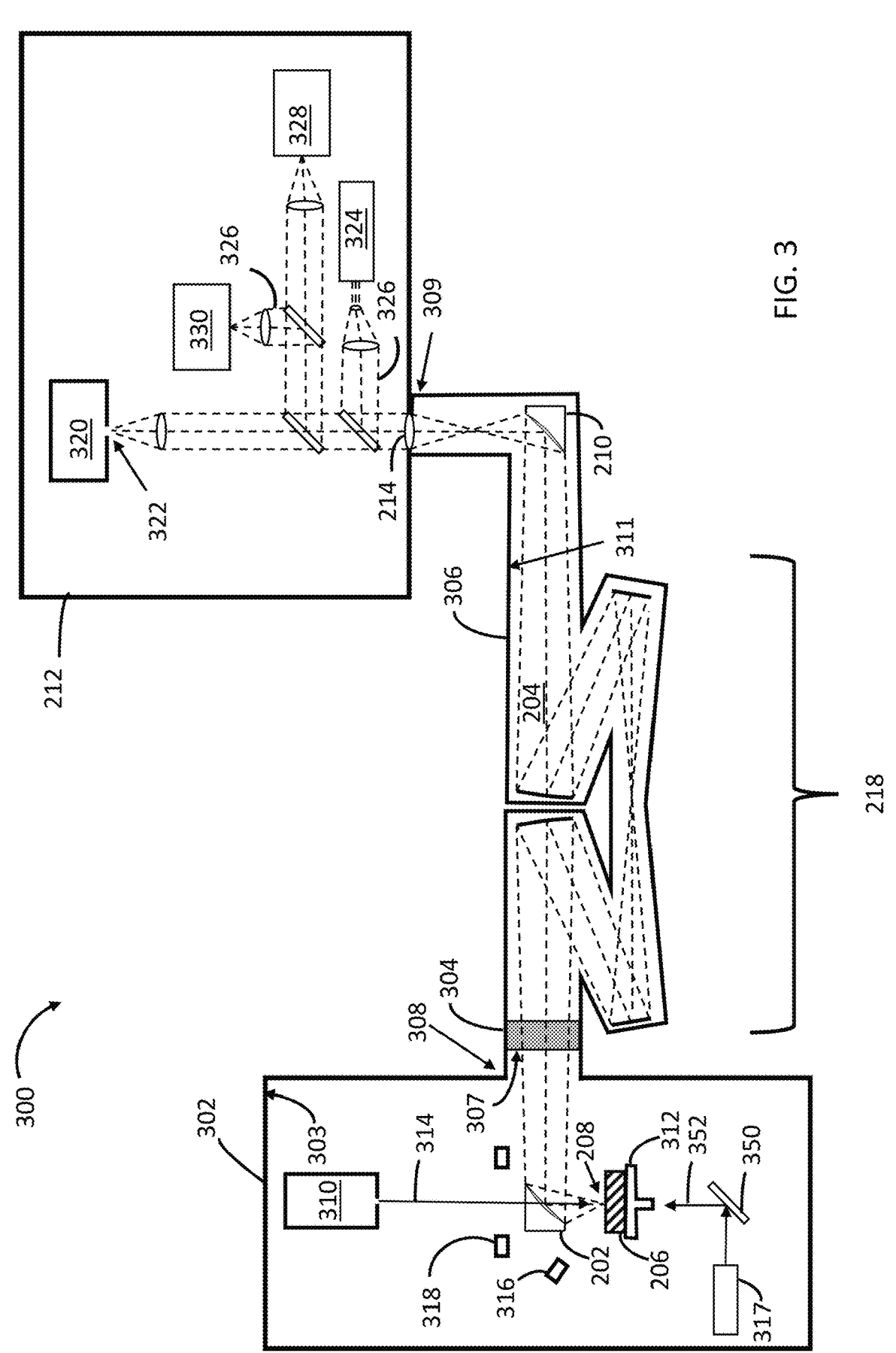
FIG. 3 is a diagram showing a spectroscopic system, according to some implementations.

In some implementations the beam extraction system 200 is included in a spectroscopic system 300, as illustrated by FIG. 3. The spectroscopic system 300 includes an enclosure 302 including the first focusing optic 202 configured to form the light beam 204 positioned in the enclosure 302 and at the focal point 208 of the first focusing optic 202. The second focusing optic 210 is configured to couple the light beam 204 to the detector 212 that is positioned outside of the enclosure 302. The optic relay 218 is coupled to the first focusing optic 202 and to the second focusing optic 210, providing an optic path for the light beam 204 from the first focusing optic 202 to the second focusing optic 210. The extraction window 304, is as previously described, and is positioned along the optic path, in the light beam 204 between the first focusing optic 202 and the second focusing optic 210. The extraction window 304 is shown mounted in a structure, such as a tube, defining a tunnel 306 that encloses the optical path of the light beam 204. The extraction window 304 can be mounted at any position in the tunnel 306. The extraction window 304 can also be mounted to an opening 308 in the enclosure 302, or at position 309 proximate to the detector 212. The inner walls 303 of the enclosure 302, the inner walls 311 of the tunnel 306, and the wall 307 of the extraction window 304 define a space containing a first environment, that is distinct from a second environment that is outside this space. As previously described, the extraction window 304 is at least partially transparent to the light beam 204 but is impervious to fluids such as gases. Therefore, the extraction window 304 allows the light beam 204 to pass through the extraction window 304, while not allowing fluids to pass through the window 304, providing a closed fluid environment for the space defined by the enclosure 302.

In some implementations, the enclosure 302 is a controlled atmosphere chamber and provides a controlled atmosphere in the first environment. The controlled atmosphere can be an inert atmosphere including an inert gas such as helium or argon. In some implementations, the controlled atmosphere is an atmosphere of reduced pressure relative to an atmosphere outside of the enclosure 302. In some implementations, the enclosure 302 is a vacuum chamber, such as a high vacuum chamber of an SEM or a moderate vacuum chamber used in an environmental SEM. For example, in some implementations the enclosure 302 is part of a scanning electron microscope, including an electron beam system 310 and a stage 312 for holding and orienting the sample 206. The first focusing optic 202 can include an opening for an electron beam 314 to pass therethrough. A secondary electron detector 316 and a backscatter detector 318 are also shown. The first focusing optic 202 is positioned to minimize the interference or to minimize shadowing of the secondary electron detector 316 and the backscatter detector 318 (e.g., above, below or parallel to the first focusing optic 202).

In some implementations, the detector 212 includes a spectrometer 320. In some implementation, the second focusing optic 210 focuses the light beam 204 directly at the entrance slit 322 of the spectrometer 320. In the implementation shown by FIG. 3, the light beam 204 is shown directed to the objective lens 214 of the spectrometer 320.

In some implementations the detector 212 includes an excitation source 324 that provides an excitation beam 326 that is merged with the light beam 204. The excitation source can include optic elements such as expanding lenses, collimating lenses and beam splitters to merge the excitation beam 326 with the light beam 204. In some implementations, the excitation source can be a laser providing a Raman excitation beam.

I some implementations, the detector 212 includes a light imager 328, such as a CCD camera. The light imager 328 can include focusing optics and filters. The light imager can be responsive to UV light, IR light and visible light. The CCD camera, when couple with the electron beam system 310 through the beam extraction system 200 (FIG. 2B) can be used to detect cathodoluminescence. Cathodoluminescence can also be directed to the spectrometer 320 for spectral analysis. In some implementations, a visible light source 330 is included and provides a visible light beam 331 that is merged with the light beam 204. The light source 330 can provide an illumination to the sample 206, which can be viewed by the light imager 328.

FIG. 3 with the excitation source 324 shows an implementation for a Raman spectrometer system. It is understood that not all components of a Raman spectrometer system for a functioning Raman spectrometer are included since these are well known in the art. Additional variations as are known in the art such as, confocal Raman microscopy, shifted-excitation Raman difference spectroscopy (SERDS), surface-enhanced Raman (SERS), and surface-enhanced resonance Raman (SERRS) can also be implemented. In addition, this Raman spectroscopy depiction should not be construed as a limited use for the beam extraction system 200. A person of ordinary skill in the art can envision implementations such as including transmission FTIR (Fourier transform infrared), reflectance FTIR. In transmission FTIR, a source is directed through the sample, where the source, such as a laser 317 can direct a light beam 352 from generally below the sample. A flat mirror 350, that redirects the light beam, and the stage 312 can have a hole aligned with the electron beam 314. The hole is wide enough for at least some of the light beam 352 to pass through and transmit through the sample 206. Similarly, the enclosure 302 can be configured for EDS (energy-dispersive X-ray) analysis and as a TEM (tunneling electron microscope). In some implementations, the electron beam system 310 is implemented in the spectroscopic system 300 with the detector 212 including only the spectrometer 320 and the light imager 328 to analyzed cathodoluminescence. The spectroscopic system 300 can also be implemented to extract light from a dangerous environment, such as the hard vacuum of space, or from a toxic environment.

Figure 4:
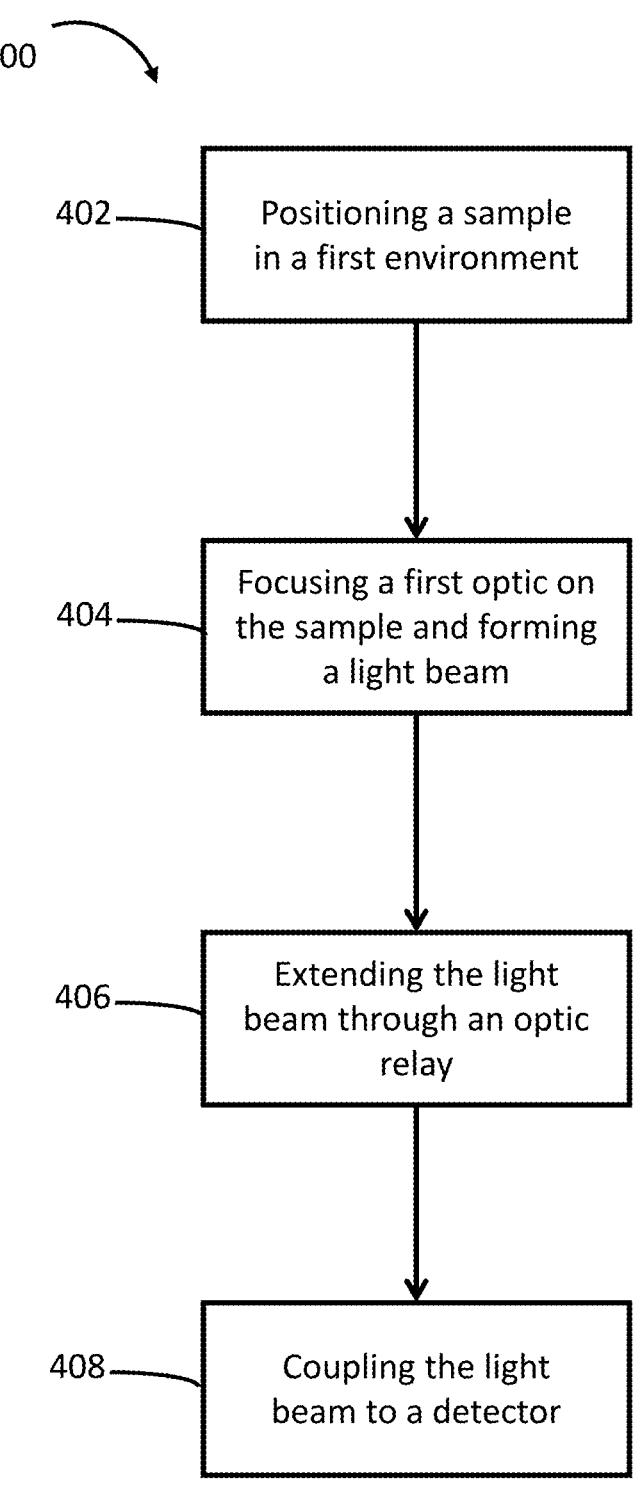
FIG. 4 is a flow diagram depicting a method of passing sample light between different environments, according to some implementations.

FIG. 4 is a flow diagram depicting a method 400, according to some implementations of this disclosure. The method is for passing sample light between different environments.

In a first step 402, the sample 206 (FIG. 3) is positioned in a first environment. For example, the enclosure 302 can be a first environment. In some implementation, the sample 206 is illuminated with a transmission light source, such as for an IR transmission or UV-vis transmission configuration. In some implementations the sample 206 is illuminated by an excitation energy source. In some implementations, the excitation energy source is selected from a visible light source, an IR light source, a UV light source, an electron beam or combinations of these. Each of the light sources can be a Laser source or a diffuse source. In some implementations the sample 206 is illuminated by a visible light source. In some implementations the sample 206 is illuminated by an IR light source. In some implementations the sample 206 is illuminated by a UV light source. In some implementations the sample 206 is illuminated by an electron beam and produces cathodoluminescence. In some implementations, the sample 206 is illuminated by a visible light source that is a laser, such as a Raman excitation laser, as well as an electron beam where the sample 206 produces Raman emission light and cathodoluminescence. In some implementations, the excitation energy source is focused by the first focusing optic 202 at the sample 206.

In a second step 404, a first optic 202 is focused on the sample 206 and the light beam 204 is formed from sample light that is received from the sample 206. For example, the sample 206 is positioned so that the focal point 208 is focused on the sample 206. This can include moving the first focusing optic 202 relative to the sample 206. In some implementations, the sample 206 is on the stage 312 which can be moved to provide for relative orientation of the sample 206 to the first focusing optic 202.

In a third step 406, the light beam 204 is extended from the first focusing optic 202 to the second focusing optic 210. This light beam extension is provided by the optic relay 218 that is coupled to the first focusing optic 202 and the second focusing optic 210. In some implementations, the optic relay 218 includes the third focusing optic 220 having a focal length of F and the fourth focusing optic 222 having a focal length of F, wherein the optic relay 218 provides a 4F optic path from the first focusing optic 202 to the second focusing optic 210.

In a final step 408, the light beam is coupled to the detector 212. The detector 212 is positioned in a second environment. In some implementations, the first environment is at a lower pressure than the second environment. For example, the first environment can be the space enclosure by the enclosure 302 and the tunnel 306 up to the extraction window 304 (left side of FIG. 3), where the second environment includes the detector 212 and the tunnel 306 up to the extraction window 304 (right side of FIG. 3).

Those having skill in the art, with the knowledge gained from the present disclosure, will recognize that various changes can be made to the disclosed apparatuses and methods in attaining these and other advantages, without departing from the scope of the present disclosure. As such, it should be understood that the features described herein are susceptible to modification, alteration, changes, or substitution. For example, it is expressly intended that all combinations of those elements and/or steps which perform substantially the same function, in substantially the same way, to achieve the same results are within the scope of the embodiments described herein. Substitutions of elements from one described embodiment to another are also fully intended and contemplated. The specific embodiments illustrated and described herein are for illustrative purposes only, and not limiting of that which is set forth in the appended claims. Other embodiments will be evident to those of skill in the art. It should be understood that the foregoing description is provided for clarity only and is merely exemplary. The spirit and scope of the present disclosure is not limited to the above examples, but is encompassed by the following claims. All publications and patent applications cited above are incorporated by reference in their entirety for all purposes to the same extent as if each individual publication or patent application were specifically and individually indicated to be so incorporated by reference.

What is claimed is:

1. A beam extraction system comprising:
a first focusing optic configured to form a light beam from light collected from a sample positioned at a focal point of the first focusing optic;
a second focusing optic configured to couple the light beam to a detector; and
an optic relay coupled to the first focusing optic and to the second focusing optic, the optic relay providing an optic path for the light beam from the first focusing optic to the second focusing optic, wherein the optic relay includes a third focusing optic having a focal length of F, a fourth focusing optic having the focal length of F, a first concave mirror positioned to reflect the light beam formed by the first focusing optic, a second concave mirror positioned to reflect the light beam to the second focusing optic, wherein the optic relay provides a 4F optic path from the first focusing optic to the second focusing optic, wherein a sum of a distance of optic path from the first concave mirror to the first focusing optic and the second concave mirror to the second focusing optic is 2F.

2. The beam extraction system according to claim 1, wherein the first concave mirror is positioned at a distance of F from the first focusing optic and the second concave mirror is positioned a distance of F from the second focusing optic.

3. The beam extraction system according to claim 1, wherein the first concave mirror and the second concave mirror are matching concave mirrors and are positioned substantially back to back.

4. The beam extraction system according to claim 1, wherein the optic relay comprises a flat mirror relay configured to reflect the light beam from the first concave mirror to the second concave mirror, traversing a distance of 2F of optic path.

5. The beam extraction system according to claim 4, wherein the flat mirror relay comprises a first flat mirror positioned in the light beam at a distance n from the first concave mirror, and a second flat mirror positioned in the beam at a distance F-n from the second concave mirror, wherein n is greater than zero and less than F $(0<n<F)$.

6. The beam extraction system according to claim 1, wherein each of the first focusing optic and the second focusing optic are independently selected from off-axis parabolic (OAP) mirrors and a Schwarzschild objective.

7. The beam extraction system according to claim 6, wherein the first focusing optic and the second focusing optic are matching OAP mirrors.

8. The beam extraction system according to claim 1 further comprising an extraction window positioned between the first focusing optic and the second focusing optic.

9. The beam extraction system according to claim 1, wherein the optic relay includes a m·4F optic path from the first focusing optic and the second focusing optic, wherein m is an integer greater than one.

10. A spectroscopic system comprising:
an enclosure including a first focusing optic configured to form a light beam from light collected from a sample positioned in the enclosure and at a focal point of the first focusing optic, wherein the enclosure includes an electron beam system configured to provide an electron beam through an opening in the first focusing optic;
a second focusing optic configured to couple the light beam to a detector positioned outside of the enclosure;
an optic relay coupled to the first focusing optic and to the second focusing optic, the optic relay providing an optic path for the light beam from the first focusing optic to the second focusing optic, wherein the first focusing optic and the second focusing optic are matching off-axis parabolic (OAP) mirrors; and
an extraction window in the optic path.

11. The spectroscopic system according to claim 10, wherein the enclosure is a controlled atmosphere chamber.

12. The spectroscopic system according to claim 10, wherein the detector includes a spectrometer.

13. The spectroscopic system according to claim 10, wherein the detector includes an excitation source providing an excitation beam that is merged with the light beam.

14. The spectroscopic system according to claim 10, wherein the detector includes a light imager.

15. A method of passing sample light between different environments, the method comprising:
positioning a sample in a first environment;
focusing a first optic on the sample and forming a light beam from a sample light received from the sample;
extending the light beam from the first focusing optic to a second focusing optic through an optic relay coupled to the first focusing optic and the second focusing optic, wherein the first focusing optic and the second focusing optic are matching off-axis parabolic (OAP) mirrors, wherein the optic relay includes a third focusing optic having a focal length of F and a fourth focusing optic having focal length of F, wherein the optic relay provides a 4F optic path from the first focusing optic to the second focusing optic; and coupling the light beam to a detector positioned in a second environment.

16. The method according to claim 15, wherein the sample is illuminated by an excitation energy source.

\* \* \* \* \*